United States Patent
Choi et al.

(10) Patent No.: US 11,894,393 B2
(45) Date of Patent: Feb. 6, 2024

(54) DISPLAY DEVICE

(71) Applicants: Samsung Display Co., LTD., Yongin-si (KR); Industry-University Cooperation Foundation Hanyang University ERICA Campus, Ansan-si (KR)

(72) Inventors: Hye Lim Choi, Yongin-si (KR); Saeroonter Oh, Seoul (KR); Kihwan Kim, Anyang-si (KR); Joon Seok Park, Yongin-si (KR); Ji Hwan Lee, Incheon (KR); Jun Hyung Lim, Seoul (KR)

(73) Assignees: SAMSUNG DISPLAY CO., LTD., Gyeonggi-Do (KR); INDUSTRY-UNIVERSITY COOPERATION FOUNDATION HANYANG UNIVERSITY ERICA CAMPUS, Gyeonggi-Do (KR)

( * ) Notice: Subject to any disclaimer, the term of this patent is extended or adjusted under 35 U.S.C. 154(b) by 231 days.

(21) Appl. No.: 17/232,211

(22) Filed: Apr. 16, 2021

(65) Prior Publication Data
US 2022/0085071 A1   Mar. 17, 2022

(30) Foreign Application Priority Data

Sep. 17, 2020   (KR) .................. 10-2020-0119880

(51) Int. Cl.
*H01L 27/14*   (2006.01)
*H01L 27/12*   (2006.01)
(Continued)

(52) U.S. Cl.
CPC ........ *H01L 27/124* (2013.01); *H01L 27/1225* (2013.01); *H01L 27/15* (2013.01);
(Continued)

(58) Field of Classification Search
CPC ... H01L 27/124; H01L 27/1225; H01L 27/15; H01L 27/3244; H01L 29/42384;
(Continued)

(56) References Cited

U.S. PATENT DOCUMENTS 10,401,697 B2*  9/2019  Yen .................. G02F 1/133345
10,838,263 B2* 11/2020  Ito ....................... G02F 1/13624
2021/0408192 A1* 12/2021  Zhang ................ H01L 27/3262

FOREIGN PATENT DOCUMENTS

KR    1020150101411 A    9/2015
KR    1020200016073 A    2/2020
(Continued)

*Primary Examiner* — Tan N Tran
(74) *Attorney, Agent, or Firm* — CANTOR COLBURN LLP

(57) ABSTRACT

An embodiment of the present invention provides a display device including a substrate and a transistor on the substrate. The transistor includes: a lower layer having conductivity and including a body portion and a plurality of protrusions; an oxide semiconductor layer including a channel region, a first conductive region disposed at a first side of the channel region, and a second conductive region disposed at a second side of the channel region, where the second side is opposite the first side; a gate electrode overlapping the channel region in a plan view; a first electrode electrically connected to the first conductive region; and a second electrode electrically connected to the second conductive region. The plurality of protrusions protrudes from the body portion, and the body portion overlaps the channel region in the plan view.

20 Claims, 12 Drawing Sheets

(51) Int. Cl.
  *H01L 29/423* (2006.01)
  *H01L 27/15* (2006.01)
  *H01L 29/786* (2006.01)
  *H10K 59/12* (2023.01)
(52) U.S. Cl.
  CPC .. *H01L 29/42384* (2013.01); *H01L 29/78633* (2013.01); *H10K 59/12* (2023.02)
(58) Field of Classification Search
  CPC ......... H01L 29/78633; H01L 29/78648; H01L 29/7869; H01L 25/0753; H01L 25/167; H01L 27/3262; H01L 33/62; H01L 27/3272; H01L 27/1255; H10K 59/12; H10K 59/1213; H10K 59/126
  USPC ............................................... 257/43, 59, 72
  See application file for complete search history.

(56) References Cited

FOREIGN PATENT DOCUMENTS

| | | |
|---|---|---|
| KR | 1020200029103 A | 3/2020 |
| KR | 1020200046508 A | 5/2020 |

\* cited by examiner

//DISPLAY DEVICE

This application claims priority to Korean Patent Application No. 10-2020-0119880 filed on Sep. 17, 2020, and all the benefits accruing therefrom under 35 U.S.C. § 119, the content of which in its entirety is herein incorporated by reference.

BACKGROUND

(a) Field

Embodiments of the present invention relate to a display device, and more particularly, to a display device including a transistor having improved characteristics.

(b) Description of the Related Art

A light emitting diode display has attracted attention as a device for displaying an image.

Since the light emitting diode display has a self-emission characteristic and does not require an additional light source, unlike a liquid crystal display device, it is possible to reduce a thickness and weight thereof. Further, the light emitting diode display has high-quality characteristics such as low power consumption, high luminance, and high response speed.

Generally, the light emitting diode display includes a substrate, a plurality of transistors disposed on the substrate, and a light emitting diode connected to the transistors. The transistor is a switching element and is a basic constituent element of a display device.

SUMMARY

A transistor used in a display device has a large data range and a large on-current, which is advantageous in improving display quality of the display device.

The present invention has been made in an effort to provide a display device including a transistor having a characteristic with a large data range and a large on-current.

An embodiment of the present invention provides a display device including a substrate and a transistor on the substrate. The transistor includes: a lower layer having conductivity and including a body portion and a plurality of protrusions; an oxide semiconductor layer including a channel region, a first conductive region disposed at a first side of the channel region, and a second conductive region disposed at a second side of the channel region, where the second side is opposite the first side; a gate electrode overlapping the channel region in a plan view; a first electrode electrically connected to the first conductive region; and a second electrode electrically connected to the second conductive region. The plurality of protrusions protrudes from the body portion, and the body portion overlaps the channel region in the plan view.

The lower layer may be electrically connected to the first electrode.

The lower layer may be electrically connected to the gate electrode.

The plurality of protrusions may protrude from opposite sides of the body portion in a first direction.

The plurality of protrusions may symmetrically protrude from the opposite sides of the body portion with respect to the body portion.

The plurality of protrusions may asymmetrically protrude from the opposite sides of the body portion with respect to the body portion.

A first portion of a protrusion of the plurality of protrusions may overlap the channel region, and the remaining portion of the protrusion except for the first portion may not overlap the channel region in the plan view.

The lower layer may define a plurality of trenches that are empty portions between the plurality of protrusions.

A first portion of a trench of the plurality of trenches may overlap the channel region, and the remaining portion of the trench except for the first portion may not overlap the channel region in the plan view.

The lower layer including the body portion and the plurality of protrusions may have a first width in a first direction, the body portion may have a second width in the first direction; the gate electrode has a gate width in the first direction, the first width of the lower layer may be larger than the gate width of the gate electrode, and the gate width of the gate electrode may be larger than the second width of the body portion.

A protrusion of the plurality of protrusions may have a first protruding width in a first direction, in which the protrusion protrudes from the body portion, and a second protruding width in a second direction crossing the first direction, and the first protruding width and the second protruding width may be the same.

The lower layer may define a plurality of trenches that are empty portions between the plurality of protrusions, a trench of the plurality of trenches may have a first trench width in the second direction, and the first trench width and the second protruding width may be the same.

Each of the first protruding width, the second protruding width, and the first trench width may be about 1.5 micrometers (μm).

The plurality of protrusions may not overlap the channel region and may overlap the first conductive region or the second conductive region in the plan view.

The lower layer including the body portion and the plurality of protrusions may have a first width in a first direction, the body portion may have a second width in the first direction, the gate electrode may have a gate width in the first direction, the second width of the body portion may be equal to or larger than the gate width of the gate electrode, and the plurality of protrusions may not overlap the channel region in the plan view.

A protrusion of the plurality of protrusions may have a first protruding width in a first direction, in which the protrusion protrudes from the body portion, and a second protruding width in a second direction crossing the first direction, and the second protruding width may be larger than the first protruding width.

The lower layer may define a plurality of trenches that are empty portions between the plurality of protrusions; a trench of the plurality of trenches may have a first trench width in the second direction, and the first trench width and the second protruding width may be the same.

Another embodiment of the present invention provides a display device including: a driving voltage line; a light emitting element including an anode and a cathode; a capacitor; a transistor including a gate electrode connected to the capacitor, an oxide semiconductor layer including a channel region, a first electrode connected to the anode of the light emitting element, and a second electrode connected to the driving voltage line; and a lower layer electrically connected to the first electrode and including a body portion overlapping the channel region of the transistor in a plan view and a plurality of protrusions protruding from the body portion.

A first portion of a protrusion of the plurality of protrusions may overlap the channel region, and the remaining portion of the protrusion except for the first portion may not overlap the channel region in the plan view.

The lower layer including the body portion and the plurality of protrusions may have a first width in a first direction, the body portion may have a second width in the first direction, the gate electrode may have a gate width in the first direction, the first width of the lower layer may be larger than the gate width of the gate electrode, and the gate width of the gate electrode may be larger than the second width of the body portion.

According to the embodiments of the present invention, it is possible to increase a data range and an on-current of a transistor used in a display device, and accordingly, it is possible to improve display quality of the display device.

It is possible to display more various gray images by increasing a data range of a driving transistor. It is possible to improve voltage charging efficiency and to implement high-speed driving of a display device, by increasing an on-current of transistors functioning as switching elements.

DETAILED DESCRIPTION

Figure 1:
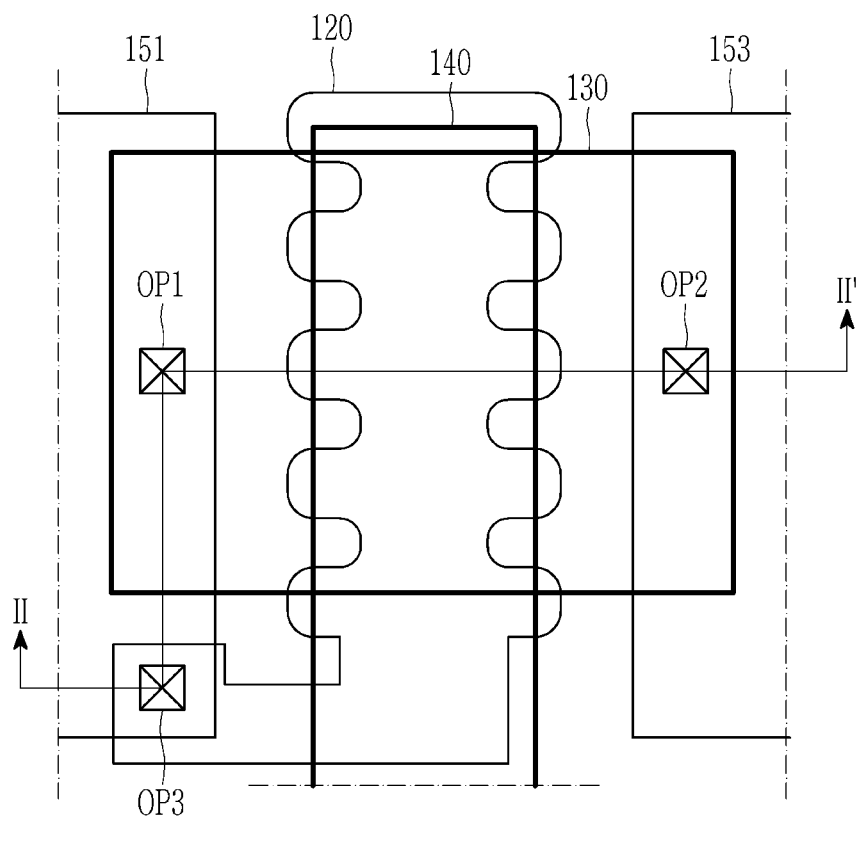
FIG. 1 illustrates a top plan view of an example of a transistor included in a display device according to an embodiment of the present invention.

Embodiments of the present invention will be described more fully hereinafter with reference to the accompanying drawings, in which embodiments of the invention are shown. As those skilled in the art would realize, the described embodiment may be modified in various different ways, all without departing from the spirit or scope of the present.

In order to clearly describe the present invention, parts that are irrelevant to the description are omitted, and identical or similar constituent elements throughout the specification are denoted by the same reference numerals.

Further, in the drawings, the size and thickness of each element are arbitrarily illustrated for ease of description, and the present disclosure is not necessarily limited to those illustrated in the drawings. In the drawings, the thicknesses of layers, films, panels, regions, areas etc., are exaggerated for clarity. In the drawings, for ease of description, the thicknesses of some layers and areas are exaggerated.

It will be understood that when an element such as a layer, film, region, area or substrate is referred to as being "on" another element, it can be directly on the other element or intervening elements may also be present. In contrast, when an element is referred to as being "directly on" another element, there are no intervening elements present. Further, in the specification, the word "on" or "above" means positioned on or below the object portion, and does not necessarily mean positioned on the upper side of the object portion based on a gravitational direction.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, the singular forms "a," "an," and "the" are intended to include the plural forms, including "at least one," unless the content clearly indicates otherwise. "At least one" is not to be construed as limiting "a" or "an." "Or" means "and/or." As used herein, the term "and/or" includes any and all combinations of one or more of the associated listed items.

In addition, unless explicitly described to a first contrary, the word "comprise" and variations such as "comprises" or "comprising" will be understood to imply the inclusion of stated elements but not the exclusion of any other elements.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value.

Further, throughout the specification, the phrase "in a plan view" or "on a plane" means viewing a target portion from the top, and the phrase "in a cross-sectional view" or "on a cross-section" means viewing a cross-section formed by vertically cutting a target portion from the side. "In a plan view" means a surface parallel to a first direction (X) and a second direction (Y), and "in a cross-sectional view" means a surface parallel to a third direction (Z) perpendicular to the first direction (X) and the second direction (Y). The second direction (Y) may cross the first direction (X). The second direction (Y) may be orthogonal to the first direction (X).

In addition, throughout this specification, "overlapping" means that some or all of target elements are overlapped and disposed in the third direction (Z) in a cross-sectional view, and some or all thereof are disposed in the same region in a plan view.

Hereinafter, a display device according to an embodiment of the present invention will be described with reference to FIG. 1 to FIG. 3.

FIG. 1 illustrates a top plan view of an example of a transistor included in a display device according to an embodiment of the present invention. FIG. 2 illustrates a cross-sectional view of the display device taken along line II-II' of FIG. 1. FIG. 3 illustrates a top plan view for explaining characteristics of a lower layer of FIG. 1.

Figure 2:
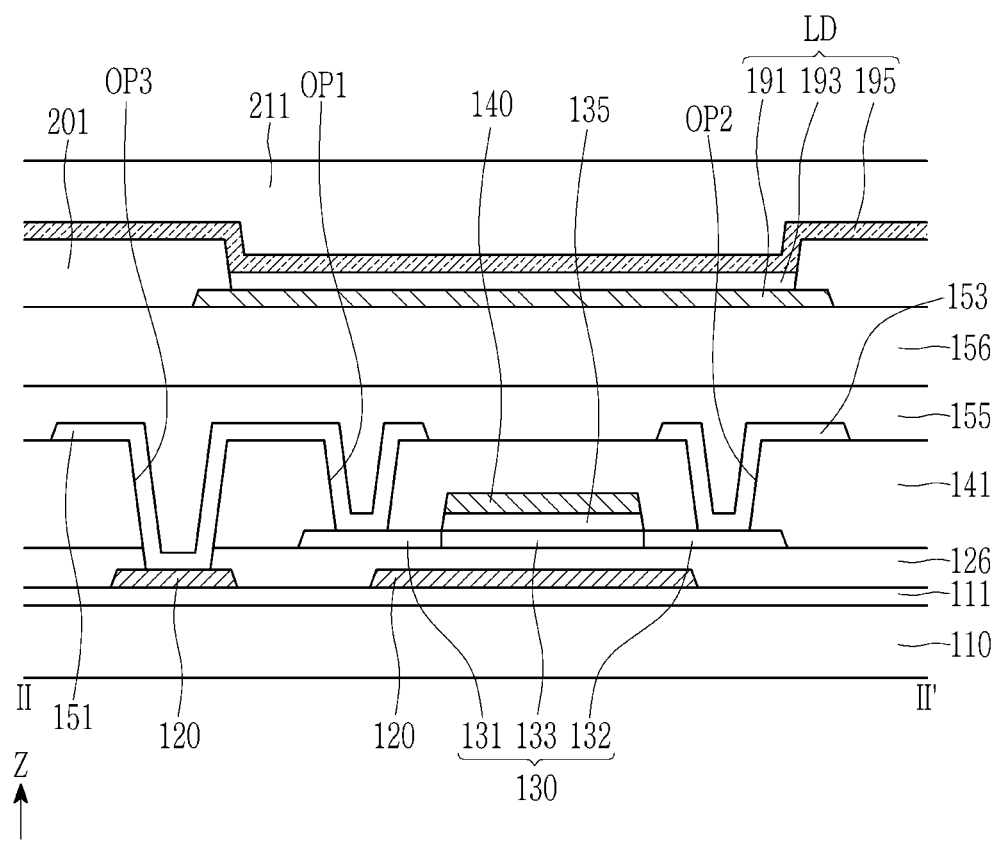
FIG. 2 illustrates a cross-sectional view of the display device taken along line II-II' of FIG. 1.
Figure 3:
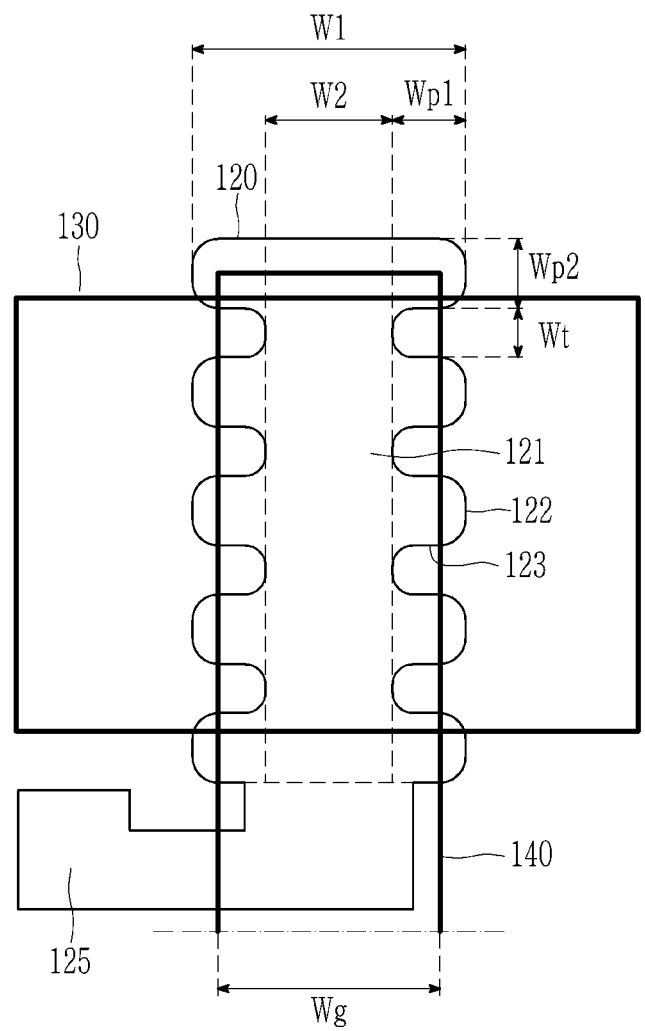
FIG. 3 illustrates a top plan view for explaining characteristics of a lower layer of FIG. 1.
Figure 3:
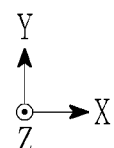

Referring to FIG. 1 to FIG. 3, a display device includes a plurality of transistors disposed on a substrate 110. Each of the plurality of transistors includes a lower layer 120, a semiconductor layer 130, a gate electrode 140, a first electrode 151, and a second electrode 153.

The substrate 110 may include glass or plastic. A barrier layer 111 is disposed on the substrate 110. The barrier layer 111 may include an inorganic insulating material such as a silicon oxide, a silicon nitride, and a silicon oxynitride. Alternatively, the barrier layer 111 may include an organic insulating material such as a polyimide or a polyacryl (epoxy added). In some embodiments, the barrier layer 111 may be omitted.

The lower layer 120 made of a conductive metal or a semiconductor material having a conductive characteristic equivalent thereto is disposed on the barrier layer 111. The lower layer 120 overlaps the semiconductor layer 130 in a plan view. The lower layer 120 may block external light so that the external light does not reach a channel region 133 of the semiconductor layer 130 to reduce a leakage current and characteristic deterioration of the channel region 133.

A buffer layer 126 is disposed on the lower layer 120. The buffer layer 126 may include an inorganic insulating material or an organic insulating material.

The semiconductor layer 130 is disposed on the buffer layer 126. The semiconductor layer 130 may include one of an oxide semiconductor, amorphous silicon, polycrystalline silicon, and single-crystalline silicon. For example, the semiconductor layer 130 may include an oxide semiconductor material including at least one of zinc (Zn), indium (In), gallium (Ga), tin (Sn), and a mixture thereof. For example, the semiconductor layer 130 may include an indium gallium zinc oxide ("IGZO").

The semiconductor layer 130 includes the channel region 133 and conductive regions 131 and 132 disposed at opposite sides of the channel region 133. The conductive regions 131 and 132 include a first conductive region 131 disposed at one side (e.g., first side) of the channel region 133 and a second conductive region 132 disposed at the other side (e.g., second side opposite the first side) of the channel region 133. The conductive regions 131 and 132 are doping regions in which doping has been performed.

A gate insulation pattern 135 is disposed on the semiconductor layer 130. The gate insulation pattern 135 may overlap the channel region 133 in a plan view. The gate insulation pattern 135 may not overlap the conductive regions 131 and 132 in a plan view.

The gate electrode 140 is disposed on the gate insulation pattern 135. The gate electrode 140 may overlap the channel region 133 of the semiconductor layer 130. in a plan view. The gate electrode 140 may include a metal such as copper (Cu), molybdenum (Mo), aluminum (Al), silver (Ag), chromium (Cr), tantalum (Ta), and titanium (Ti), or a metal alloy thereof. The gate electrode 140 may be a single layer or a multilayer.

A second gate insulating layer 141 is disposed on the gate electrode 140, and the first electrode 151 and the second electrode 153 are disposed on the second gate insulating layer 141. The second gate insulating layer 141 defines a first opening OP1 overlapping the first conductive region 131, a second opening OP2 overlapping the second conductive region 132, and a third opening OP3 overlapping the lower layer 120 in a plan view.

The first electrode 151 may contact the first conductive region 131 of the semiconductor layer 130 through the first opening OP1. That is, the first electrode 151 is electrically connected to the first conductive region 131 of the semiconductor layer 130. The second electrode 153 may contact the second conductive region 132 of the semiconductor layer 130 through the second opening OP2. That is, the second electrode 153 is electrically connected to the second conductive region 132 of the semiconductor layer 130. The third opening OP3 passes through the buffer layer 126 and the second gate insulating layer 141. The first electrode 151 may contact the lower layer 120 through the third opening OP3. That is, the first conductive region 131 of the semiconductor layer 130 may be electrically connected to the lower layer 120 by the first electrode 151. One of the first electrode 151 and the second electrode 153 may be a source electrode, and the other thereof may be a drain electrode.

The first electrode 151 and the second electrode 153 may include a metal such as aluminum (Al), copper (Cu), silver (Ag), gold (Au), platinum (Pt), palladium (Pd), nickel (Ni), molybdenum (Mo), tungsten (W), titanium (Ti), chromium (Cr), and tantalum (Ta), or a metal alloy thereof. The first electrode 151 and the second electrode 153 may be a single layer or a multilayer.

Lower planarization layers 155 and 156 are disposed on the first electrode 151 and the second electrode 153. The lower planarization layers 155 and 156 may include a first lower planarization layer 155 and a second lower planarization layer 156. The first lower planarization layer 155 may be disposed on the first electrode 151 and the second electrode 153, and the second lower planarization layer 156 may be disposed on the first lower planarization layer 155. The first lower planarization layer 155 may include an inorganic insulating material. The second lower planarization layer 156 may include an organic insulating material, and may include at least one material of a polyimide, a polyamide, an acryl resin, benzocyclobutene, and a phenol resin.

A light emitting element LD and an encapsulation layer 211 are disposed on the lower planarization layers 155 and 156. The light emitting element LD includes a pixel electrode 191, an emission layer 193, and a common electrode 195.

The pixel electrode 191 is also referred to as an anode electrode, and may be a single layer or a multilayer that includes a transparent conductive oxide film and a metal material. The transparent conductive oxide film may include an indium tin oxide ("ITO"), a poly-ITO, an indium zinc oxide ("IZO"), an indium gallium zinc oxide (IGZO), and an indium tin zinc oxide ("ITZO"). The metal material may include silver (Ag), molybdenum (Mo), copper (Cu), gold (Au), and aluminum (Al).

Although not illustrated in FIG. 1 to FIG. 3, the lower planarization layers 155 and 156 define openings exposing the first electrode 151 or the second electrode 153. The pixel electrode 191 may contact the first electrode 151 or the second electrode 153 of the transistor through the openings of the lower planarization layers 155 and 156. That is, the pixel electrode 191 may be electrically connected to the first electrode 151 or the second electrode 153 of the transistor.

A partition wall 201 is disposed on the pixel electrode 191 and the lower planarization layers 155 and 156. The partition wall 201 is also referred to as a pixel defining layer ("PDL") that partitions a position of the emission layer 193. The partition wall 201 exposes a portion of an upper surface of the pixel electrode 191, and the emission layer 193 is disposed on the exposed upper surface of the pixel electrode 191. The partition wall 201 may be an organic insulation film containing one or more of a polyimide, a polyamide, an acryl resin, benzocyclobutene, and a phenol resin. In some embodiments, the partition wall 201 may be formed of a black PDL including a black color pigment.

The emission layer 193 may include an organic material that emits red, green, or blue light. The emission layer 193 that emits red, green, or blue light may include a low molecular weight or high molecular weight organic material. Although the emission layer 193 is illustrated as a single layer in FIG. 2, a hole injection layer and a hole transporting layer may be disposed at a lower portion of the emission layer 193, or the electron transporting layer and the electron injection layer may be disposed at an upper portion of the emission layer 193.

The common electrode 195 is disposed on the partition wall 201 and the emission layer 193. The common electrode 195 is also referred to as a cathode electrode, and may be a transparent conductive layer including an ITO, an IZO, an IGZO, and an ITZO. In addition, the common electrode 195 may have a translucent characteristic, and in this case, it may form a micro-cavity together with the pixel electrode 191. According to the structure of the micro-cavity, light with a specific wavelength is emitted upward by a gap and characteristic between electrodes at opposite ends of the micro-cavity, and as a result, red, green, or blue colors may be displayed.

The encapsulation layer 211 is disposed on the common electrode 195, and protects the light emitting device LD from moisture or oxygen that may be introduced from the outside. The encapsulation layer 211 may include at least one inorganic film and at least one organic film.

Hereinafter, a planar feature of the lower layer 120 will be described in detail with reference to FIG. 3. In FIG. 3, only the lower layer 120, the semiconductor layer 130, and the gate electrode 140 are illustrated in order to focus on characteristics of the lower layer 120.

The semiconductor layer 130 may generally extend in the first direction (X), and the gate electrode 140 may generally extend in the second direction (Y), thus the gate electrode 140 may partially overlap the semiconductor layer 130 in a plan view. A portion of the semiconductor layer 130 that overlaps the gate electrode 140 is the channel region 133 of the transistor illustrated in FIG. 2. A portion of the semiconductor layer 130 that does not overlap the gate electrode 140 in a plan view is the conductive regions 131 and 132 of the transistor illustrated in FIG. 2.

The lower layer 120 includes a body portion 121, a plurality of protrusions 122, a plurality of trenches 123, and a connection portion 125.

The body portion 121 overlaps the gate electrode 140 to extend in the second direction (Y). The body portion 121 may overlap the channel region 133 of the semiconductor layer 130 in a plan view.

The protrusion 122 may protrude from the body portion 121 in the first direction (X). The plurality of protrusions 122 may protrude to opposite sides of the body portion 121 in the first direction (X). The plurality of protrusions 122 may be symmetrically protruded from the opposite sides with respect to the body portion 121. That is, the protrusion 122 positioned at one side (e.g., first side) of the body portion 121 may face the protrusion 122 positioned at the other side (e.g., second side opposite the first side) of the body portion 121 in the first direction (X) with the body portion 121 interposed therebetween. In addition, the trench 123 positioned at one side of the body portion 121 may face the trench 123 positioned at the other side of the body portion 121 in the first direction (X) with the body portion 121 interposed therebetween.

A first portion of the protrusion 122 which is directly connected to the body portion 121 may overlap the channel region 133 of the semiconductor layer 130 in a plan view, and a second portion (i.e., the remaining portion) thereof may not overlap the channel region 133 of the semiconductor layer 130. That is, the second portion (i.e., an end portion) of the protrusion 122 may not overlap the channel region 133 of the semiconductor layer 130. In other words, the first portion of the protrusion 122 may not overlap the conductive regions 131 and 132 of the semiconductor layer 130, and the second portion may overlap the conductive regions 131 and 132 of the semiconductor layer 130 in a plan view. The overlapping relation between the protrusion 122 and the channel region 133 is applied the same to the overlapping relation between the protrusion 122 and the gate electrode 140.

The trench 123 is an empty portion defined between the protrusions 122 adjacent in the second direction (Y). A portion of the trench 123 may overlap the channel region 133 of the semiconductor layer 130, and the remaining portion thereof may not overlap the channel region 133 of the semiconductor layer 130 in a plan view. That is, a portion of the trench 123 adjacent to the body portion 121 may overlap the channel region 133 of the semiconductor layer 130, and a portion thereof adjacent to an end portion of the protrusion 122 may not overlap the channel region 133 of the semiconductor layer 130. In other words, the portion of the trench 123 adjacent to the body portion 121 may not overlap the conductive regions 131 and 132 of the semiconductor layer 130, and the remaining portion thereof adjacent to an end portion of the protrusion 122 may overlap the conductive regions 131 and 132 of the semiconductor layer 130.

The connection portion 125 is a portion that is positioned at one side of the body portion 121 (for example, an end of the second direction (Y)) and does not overlap the semiconductor layer 130 in a plan view. The connection portion 125 may be a portion for physically and electrically connecting the first electrode 151 and the lower layer 120 as illustrated in FIG. 1. The connection portion 125 may overlap the third opening OP3, and may contact the first electrode 151 through the third opening OP3. A shape of the connection portion 125 according to the invention is not limited to the shape shown in FIG. 3.

The lower layer 120 may have a first width W1 in the first direction (X) in which the body portion 121 and the protrusions 122 at both sides thereof are included. That is, the first width W1 is a distance between a distal end of the protrusion 122 protruding from the first side of the body portion 121 in the first direction (X) and a distal end of the protrusion 122 protruding from the second side of the body portion 121 in the first direction (X). In measuring the first width W1, the connection portion 125 that does not overlap the semiconductor layer 130 is excluded. The body portion 121 has a second width W2 in the first direction (X). The protrusion 122 may have a first protruding width Wp1 in the first direction (X) and a second protruding width Wp2 in the second direction (Y). The first direction (X) is a direction in which the protrusion 122 protrudes from the body portion 121. The trench 123 may have a first trench width Wt in the second direction (Y). Since the trench 123 is a portion between adjacent protrusions 122, a width of the trench 123 in the first direction (X) is equal to the first protruding width Wp1 of the protrusion 122.

Sizes of the protrusion 122 and the trench 123 of the lower layer 120 may be designed by reflecting etching precision in a manufacturing process of the display device. The first protruding width Wp1 and the second protruding width Wp2 of the protrusion 122 may have the same size. The first trench width Wt of the trench 123 and the second protruding width Wp2 of the protrusion 122 may have the same size. For example, the first protruding width Wp1 and the second protruding width Wp2 of the protrusion 122, and the first trench width Wt of the trench 123 may be 1.5 micrometers (μm), respectively.

In other words, the first width W1 of the lower layer 120 is larger than a gate width Wg in the first direction (X) of the gate electrode 140. In addition, the gate width Wg of the gate electrode 140 is larger than the second width W2 of the body portion 121. The gate width Wg of the gate electrode 140 is the same as a width in the first direction (X) of the channel region 133 of the semiconductor layer 130. That is, the relationship of "W1>Wg>W2" may be satisfied.

As the first width W1 of the lower layer 120 becomes larger than the gate width Wg of the gate electrode 140, a driving range of the transistor may be increased, and an on-current (i.e., current in an on-state) of the transistor may be increased. In addition, as the lower layer 120 includes the plurality of protrusions 122 and the plurality of trenches 123, an overlapping region of the lower layer 120 and the conductive regions 131 and 132 may be reduced, and a parasitic capacitance between the lower layer 120 and the conductive regions 131 and 132 may be reduced. Accordingly, the characteristic of the transistor may be further improved.

Figure 4:
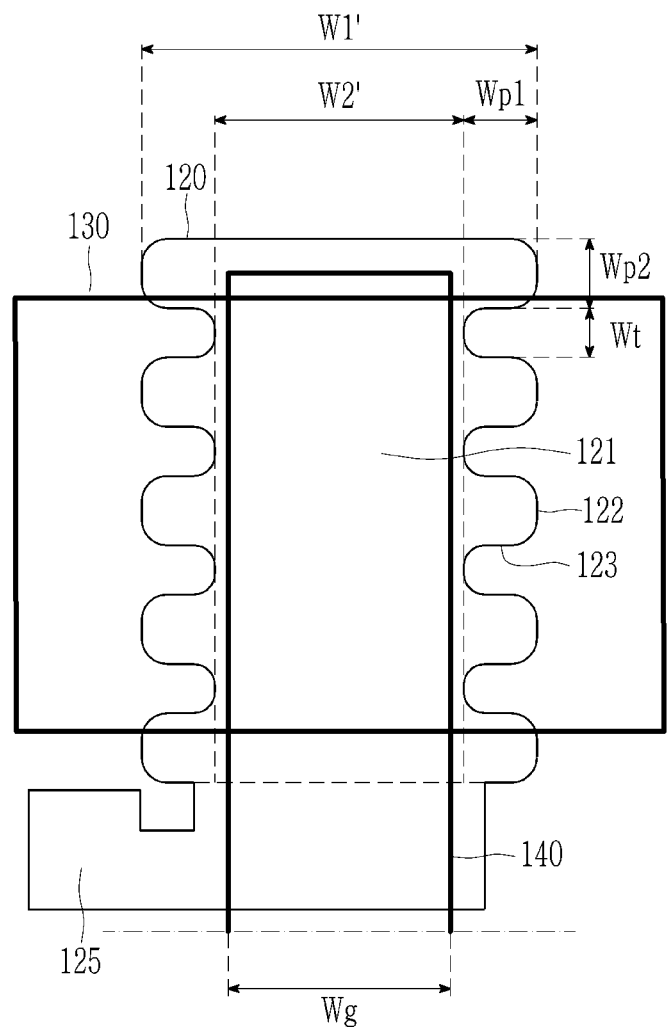
FIG. 4 illustrates a top plan view for explaining a lower layer according to another embodiment of the present invention.
Figure 5:
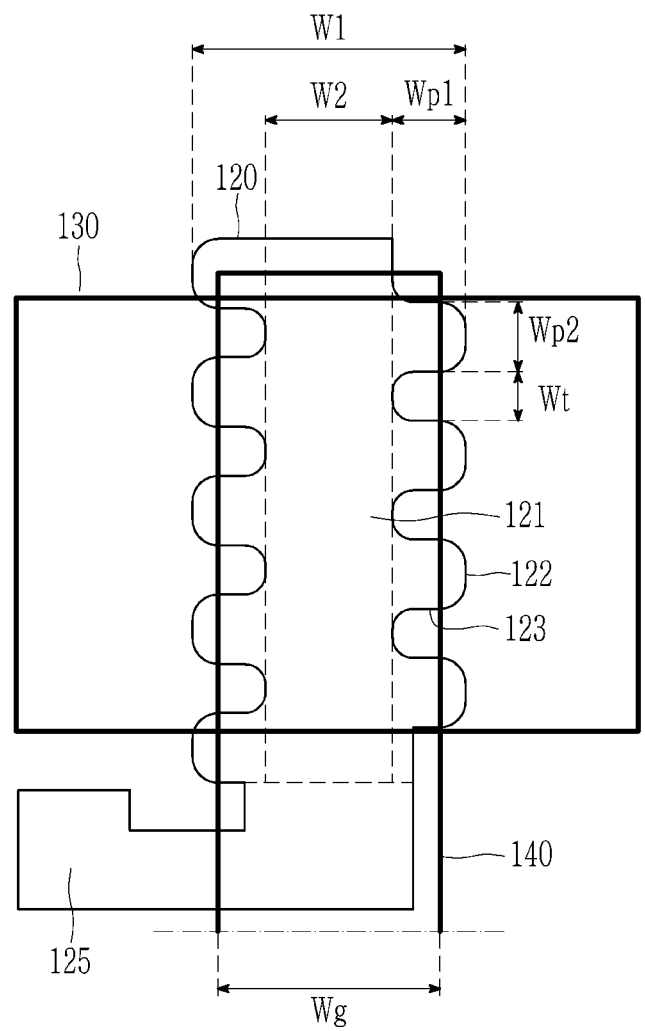
FIG. 5 illustrates a top plan view for explaining a lower layer according to still another embodiment of the present invention.
Figure 5:
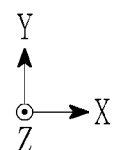
Figure 6:
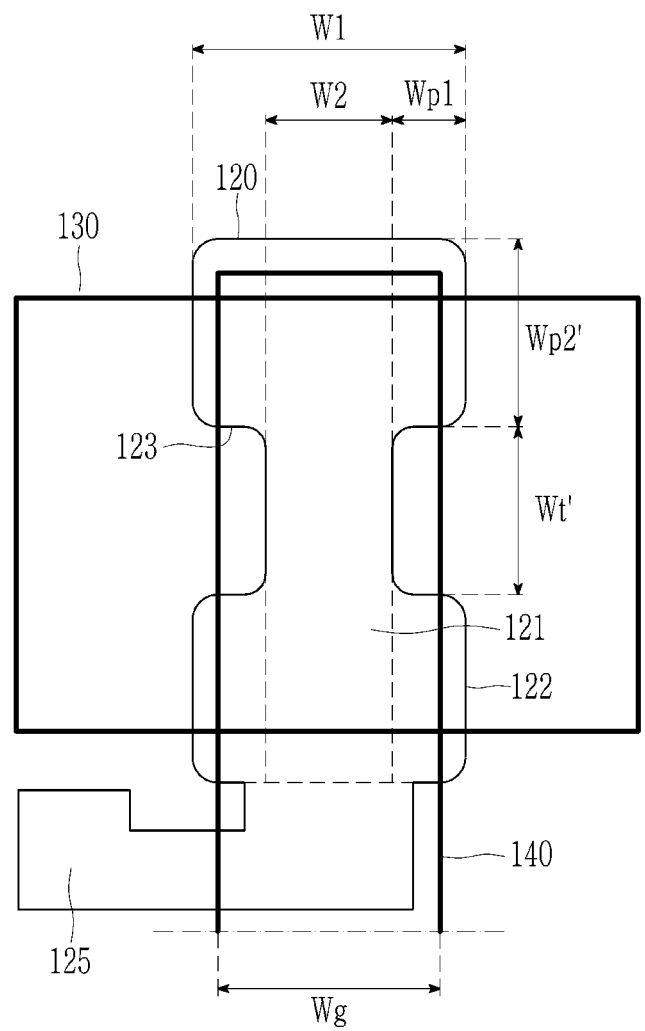
FIG. 6 illustrates a top plan view for explaining a lower layer according to yet another embodiment of the present invention.

Hereinafter, other embodiments of the lower layer 120 will be described in detail with reference to FIG. 4 to FIG. 6. In FIG. 4 to FIG. 6, only the lower layer 120, the semiconductor layer 130, and the gate electrode 140 are illustrated in order to focus on characteristics of the lower layer 120. Features that are different from the above-described embodiment of FIG. 3 will be mainly described.

FIG. 4 illustrates a top plan view for explaining a lower layer according to another embodiment of the present invention.

Referring to FIG. 4, the second width W2' of the lower layer 120 may be equal to or greater than the gate width Wg of the gate electrode 140. That is, the second width W2 of the body portion 121 may be equal to or greater than the gate width Wg of the gate electrode 140. The protrusion 122 and the trench 123 may not overlap the channel region 133 of the semiconductor layer 130 in a plan view. That is, the protrusion 122 and the trench 123 may not overlap the gate electrode 140 in a plan view. The protrusion 122 and the trench 123 may overlap the conductive regions 131 and 132 of the semiconductor layer 130. Therefore, the relationship of "W1'>W2'>Wg" may be satisfied.

FIG. 5 illustrates a top plan view for explaining a lower layer according to still another embodiment of the present invention.

Referring to FIG. 5, the plurality of protrusions 122 of the lower layer 120 may be asymmetrically protruded toward opposite sides (e.g., first and second sides) thereof with respect to the body portion 121. That is, the protrusion 122 positioned at one side (e.g., first side) of the body portion 121 may face the trench 123 positioned at the other side (e.g., second side) of the body portion 121 in the first direction (X) with the body portion 121 interposed therebetween.

FIG. 6 illustrates a top plan view for explaining a lower layer according to yet another embodiment of the present invention.

Referring to FIG. 6, the second protruding width Wp2' in the second direction (Y) may be larger than the first protruding width Wp1 of the protrusion 122. In addition, the first trench width Wt' of the trench 123 in the second direction (Y) may be the same as the second protruding width Wp2' of the protrusion 122. In this case, even though the number of protrusions 122 and trenches 123 included in the lower layer 120 is reduced compared to the embodiment in FIG. 3, but by properly disposing the protrusions 122 and the trenches 123, the total overlapping area of the lower layer 120 and the conductive regions 131 and 132 in this embodiment may be kept as the same as the total overlapping area of the lower layer 120 and the conductive regions 131 and 132 in the embodiment in FIG. 3. That is, the overlapping region of the lower layer 120 and the conductive regions 131 and 132 in this embodiment may be reduced as in the embodiment of FIG. 3.

One of the planar features of the lower layer 120 according to the embodiments of FIG. 3 to FIG. 6 may be applied to the display device, while the planar features of the lower layer 120 according to the embodiments of FIG. 3 to FIG. 6 may be combined to be configured in the display device.

Hereinafter, referring to FIG. 7, a pixel of a display device to which an embodiment of the present invention may be applied will be described.

Figure 7:
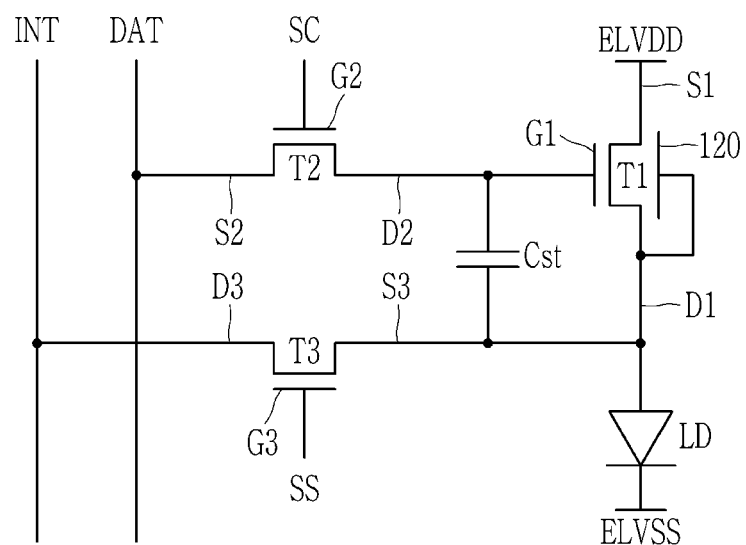
FIG. 7 illustrates a circuit diagram of a pixel included in a display device according to an embodiment of the present invention.

FIG. 7 illustrates a circuit diagram of a pixel included in a display device according to an embodiment of the present invention.

Referring to FIG. 7, the display device according to the embodiment includes a plurality of pixels. One pixel may include a plurality of transistors T1, T2, and T3, a capacitor Cst, and a light emitting element LD.

The plurality of transistors T1, T2, and T3 includes a first transistor T1, a second transistor T2, and a third transistor T3.

The first transistor T1 includes a gate electrode G1, a first electrode D1, and a second electrode S1. The gate electrode G1 is connected to one end of the capacitor Cst. The first electrode D1 is connected to the anode of the light emitting element LD and the other end of the capacitor Cst. The second electrode S1 is connected to a driving voltage line that transmits a driving voltage ELVDD. The first transistor T1 may include the lower layer 120, and the lower layer 120 may be connected to the first electrode D1. The first transistor T1 may supply a driving current to the light emitting element LD in response to a data voltage DAT transmitted according to a switching operation of the second transistor T2.

The second transistor T2 includes a gate electrode G2, a first electrode D2, and a second electrode S2. The gate electrode G2 is connected to a first scan line that transmits a first scan signal SC. The first electrode D2 is connected to the one end of the capacitor Cst and the gate electrode G1 of the first transistor T1. The second electrode S2 is connected to a data line that may transmit the data voltage DAT or a reference voltage. The second transistor T2 is turned on according to the first scan signal SC to transmit the reference voltage or data voltage DAT to the gate electrode G1 of the first transistor T1 and one end of the capacitor Cst.

The third transistor T3 includes a gate electrode G3, a first electrode D3, and a second electrode S3. The gate electrode G3 is connected to a second scan line that transmits a second scan signal SS. The first electrode D3 is connected to an initialization voltage line that transmits an initialization voltage INT. The second electrode S3 is connected to the other end of the capacitor Cst, the first electrode D1 of the first transistor T1, and the anode of the light emitting element LD. The third transistor T3 is turned on according to the second scan signal SS to transmit the initialization voltage INT to the anode of the light emitting element LD and the other end of the capacitor Cst, thereby initializing an anode voltage of the light emitting element LD.

The one end of the capacitor Cst is connected to the gate electrode G1 of the first transistor T1, and the other end of the capacitor Cst is connected to the second electrode S3 of the third transistor T3 and the anode of the light emitting element LD. A cathode of the light emitting element LD is connected to a common voltage line that transmits a second power supply voltage ELVSS.

The light emitting element LD may emit light according to the driving current transmitted through the first transistor T1.

The first transistor T1 may be configured as the transistor according to the embodiment of FIG. 1 to FIG. 6.

Hereinafter, a display device including a pixel according to an embodiment of the present invention will be described with reference to FIG. 8 to FIG. 10.

Figure 8:
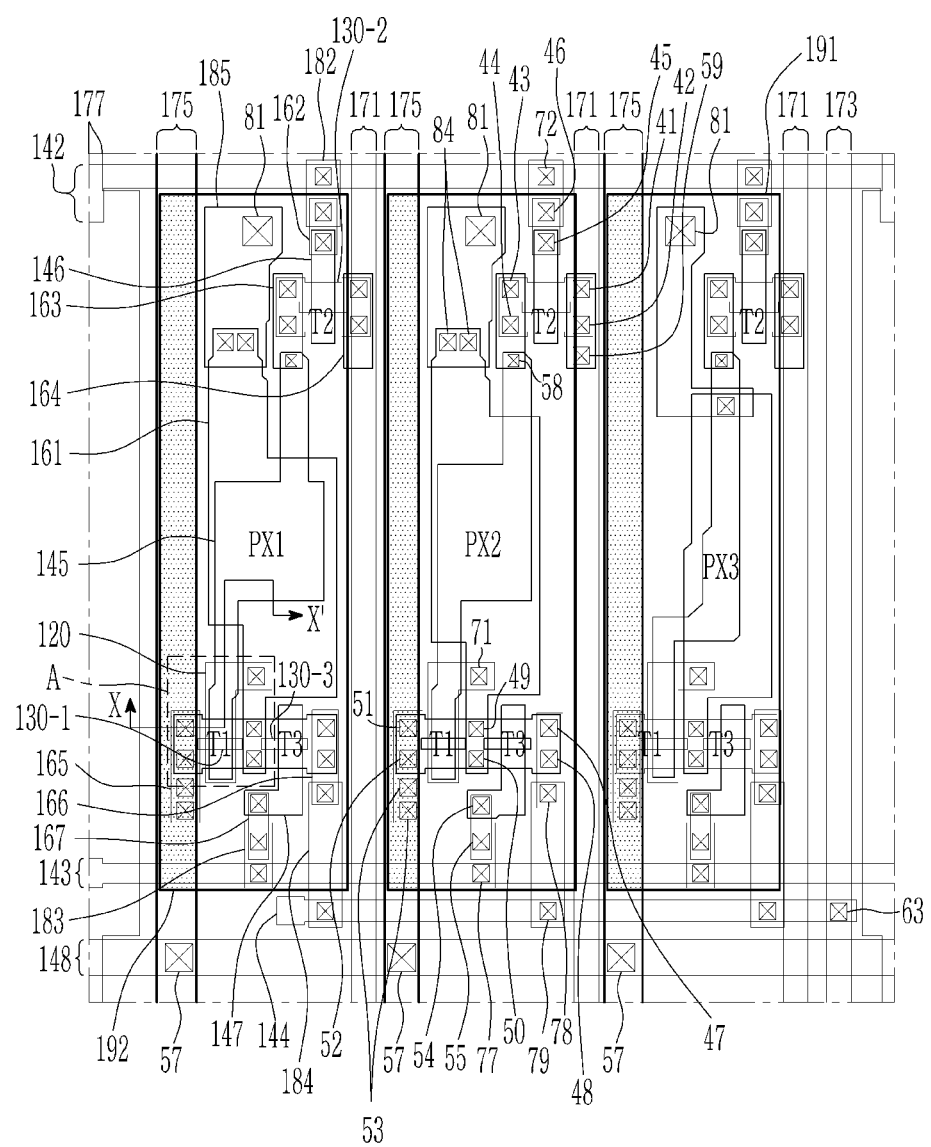
FIG. 8 illustrates a layout view of a pixel included in a display device according to an embodiment of the present invention.

FIG. 8 illustrates a layout view of a pixel included in a display device according to an embodiment of the present invention. FIG. 9 illustrates an enlarged view of area "A" of FIG. 8. FIG. 10 illustrates a cross-sectional view of the display device taken along line X-X' of FIG. 8.

Figure 9:
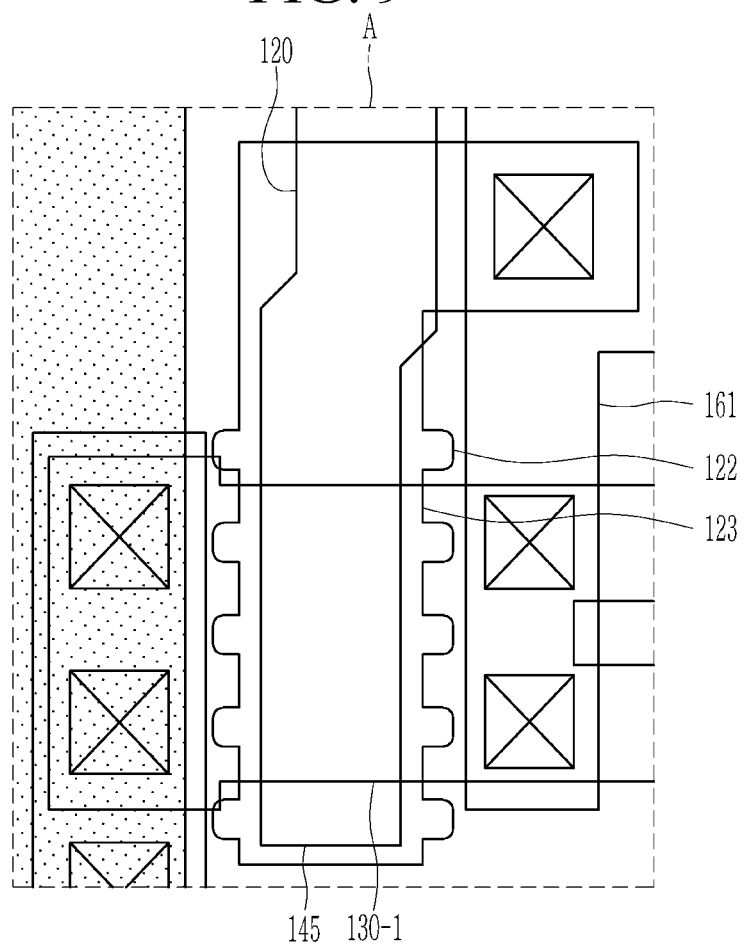
FIG. 9 illustrates an enlarged view of area "A" of FIG. 8.
Figure 10:
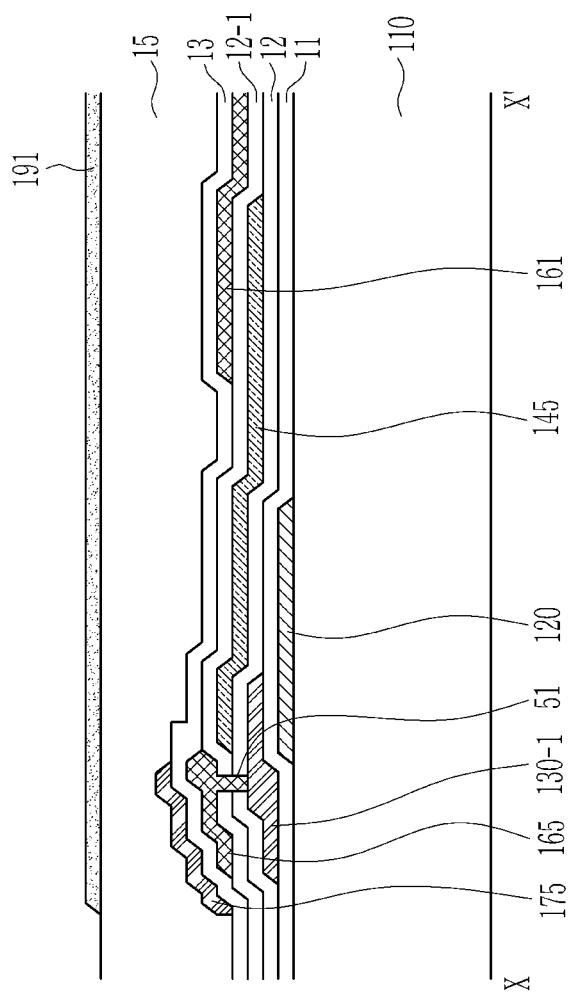
FIG. 10 illustrates a cross-sectional view of the display device taken along line X-X' of FIG. 8.

Referring to FIG. 8 to FIG. 10, the display device includes the lower layer 120, semiconductor layers 130-1, 130-2, and 130-3, gate layers 142, 143, 144, 145, 146, 147, and 148, second gate layers 161, 162, 163, 164, 165, 166, and 167, data layers 171, 173, 175, 177, 182, 183, 184, and 185, a pixel electrode 191, an emission layer (not shown), and a common electrode (not shown), which are sequentially stacked on the substrate 110. They are insulated from each other by an insulating film, except when connected to each other by a contact opening.

The lower layer 120 includes a channel overlapping portion and a connection portion overlapping the channel region of the first transistor T1. The connection portion of the lower layer 120 is connected to a storage electrode 161 to be described later. Since the storage electrode 161 receives the anode voltage, the lower layer 120 also receives the anode voltage. The lower layer 120 may form an overlapping capacitor in a region overlapping a gate electrode 145 of the first transistor T1.

As illustrated in FIG. 9, the lower layer 120 includes the protrusion 122 and the trench 123. FIG. 9 illustrates that the protrusion 122 and the trench 123 of the lower layer 120 do not overlap the gate electrode 145 (or channel region) as in the embodiment of FIG. 4, but the lower layer 120 may be formed so that the protrusion 122 and the trench 123 overlap the gate electrode 145 in a plan view as in the embodiment of FIG. 3, the lower layer 120 may be formed asymmetrically as in the embodiment of FIG. 5, and the lower layer 120 may be formed so that the protrusion 122 and the trench 123 have various sizes as in the embodiment of FIG. 6.

A buffer layer 11 is covered on the substrate 110 and the lower layer 120. The buffer layer 11 may include an inorganic insulating material.

The semiconductor layers 130-1, 130-2, and 130-3 are disposed on the buffer layer 11. Each of the semiconductor layers 130-1, 130-2, and 130-3 includes channels of the first transistor T1, the second transistor T2, and the third transistor T3. The semiconductor layers 130-1, 130-2, and 130-3 according to the present embodiment may be formed of or include an oxide semiconductor. The first semiconductor 130-1 is a semiconductor layer of the first transistor T1, and includes a channel region and conductive regions disposed at respective sides of the channel region. The second semiconductor 130-2 is a semiconductor layer of the second transistor T2, and includes a channel region and conductive regions disposed at respective sides of the channel region. The third semiconductor 130-3 is a semiconductor layer of the third transistor T3, and includes a channel region and conductive regions disposed at respective sides of the channel region.

The channel region of each of the semiconductor layers 130-1, 130-2, and 130-3 may be formed with two lines in a form including an opening included in a center of a quadrangular shape, or the channel region of each of the semiconductor layers 130-1, 130-2, and 130-3 may be formed with only one line to connect the conductive regions. The conductive region of each of the semiconductor layers 130-1, 130-2, and 130-3 may extend to be electrically connected to another layer through a contact opening.

A first gate insulating film 12 is covered on the semiconductor layers 130-1, 130-2, and 130-3 and the buffer layer 11. The first gate insulating film 12 may include an inorganic insulating material.

The gate layers 142, 143, 144, 145, 146, 147, and 148 are disposed on the first gate insulating film 12. The gate layers 142, 143, 144, 145, 146, 147, and 148 include a scan line 142, a previous scan line 143, an initialization voltage transmitting portion 144, a gate electrode 145 of the first transistor T1, a gate electrode 146 of the second transistor T2, a gate electrode 147 of the third transistor T3, and a horizontal driving voltage line 148.

The scan line 142 and the previous scan line 143 extend in a row direction.

The initialization voltage transmitting portion 144 has an island-like structure extended in the row direction. The initialization voltage transmitting portion 144 is a structure for connecting an initialization voltage line 173 formed per pixel columns of a predetermined number, and a plurality of pixels. That is, the initialization voltage transmitting portion 144 passes the pixel PX adjacent in the row direction to extend to a position at which the initialization voltage line 173 is formed. In the present embodiment, the initialization voltage line 173 is formed one by one for each pixel PX including three subpixels PX1, PX2, and PX3.

The horizontal driving voltage line 148 extends in the row direction, and crosses the driving voltage line 175 that extends in the column direction. The horizontal driving voltage line 148 is disposed between the adjacent pixels PX in the row direction, and is electrically connected to the driving voltage line 175 through a contact opening 57 for each adjacent subpixel PX1, PX2, or PX3 in the column direction.

The gate electrode 145 of the first transistor T1 includes an overlapping portion overlapping the first semiconductor 130-1 in which the channel of the first transistor T1 is disposed, an expansion extending and expanding from the overlapping portion, and an extension connected to the second semiconductor 130-2 of the second transistor T2. Only the overlapping portion of the gate electrode 145 of the driving transistor T1 may serve as a gate electrode, and the expansion may form one electrode of the capacitor Cst. In addition, the expansion of the gate electrode 145 may overlap an expansion of the lower layer 120 to form an overlapping capacitor. In addition, the extension of the gate electrode 145 is connected to the second semiconductor 130-2 of the second transistor T2 through contact openings 43, 44, and 58 and a second gate layer connection 163 to receive a data voltage from the second electrode of the second transistor T2.

FIG. 8 illustrates three subpixels PX1, PX2, and PX3 forming one pixel PX, and an extension of the gate electrode 145 of the first transistor T1 of each subpixel PX1, PX2, or PX3 is in various sizes.

The gate electrode 146 of the second transistor T2 has an island-like structure, and overlaps the second semiconductor 130-2 of the second transistor T2. The channel of the second transistor T2 is disposed at a position in which the second semiconductor 130-2 and the gate electrode 146 overlap. The gate electrode 146 is electrically connected to the scan line 142 through a second gate electrode connection portion 182 and a second gate layer connection portion 162.

The gate electrode 147 of the third transistor T3 has an island-like structure, and overlaps the third semiconductor 130-3 of the third transistor T3. The channel of the third transistor T3 is disposed at a position in which the third semiconductor 130-3 and the gate electrode 147 overlap. The gate electrode 147 is electrically connected to the previous scan line 143 through a third gate electrode connection portion 183 and the second gate layer connection portion 167.

A second gate insulating film 12-1 is covered on the gate layers 142, 143, 144, 145, 146, 147, and 148 and the first gate insulating film 12. The second gate insulating film 12-1 may include an inorganic insulating material.

The second gate layers 161, 162, 163, 164, 165, 166, and 167 are disposed on the second gate insulating film 12-1. The second gate layers 161, 162, 163, 164, 165, 166, and 167 include a storage electrode 161 and second gate layer connection portions 162, 163, 164, 165, 166, and 167.

The storage electrode 161 has an extension part overlapping an extension of the gate electrode 145 of the first transistor T1, and includes a first extension and a second extension vertically extending from the extension. The first extension extending downward from the extension of the storage electrode 161 is connected to the first electrode of the first transistor T1 through contact openings 49 and 50, and is connected to the lower layer 120 through a contact opening 71. In addition, the second extension extending upward from the extension of the storage electrode 161 is connected to the anode connection portion 185 through a contact opening 84. The extension of the storage electrode 161 overlaps the gate electrode 145 to form the capacitor Cst.

The second gate layer connection portion 162 has an island-like structure, and overlaps the second gate electrode connection portion 182 and the gate electrode 146 of the second transistor T2. The second gate electrode connection portion 182 is connected to the second gate electrode connection portion 182 and the gate electrode 146 of the second transistor T2 through contact openings 46 and 45, respectively.

The second gate layer connection portion 163 has an island-like structure, and overlaps a first electrode (i.e., output side electrode) among the gate electrode 145 of the first transistor T1 and the second semiconductor 130-2 of the second transistor T2. The second gate layer connection portion 163 is connected to a first electrode (i.e., output side electrode) of the second semiconductor 130-2 of the second transistor T2 through the two contact openings 43 and 44, and is connected to the gate electrode 145 of the driving transistor T1 through the contact opening 58.

The second gate layer connection portion 164 has an island-like structure, and overlaps the data line 171 and a second electrode of the second semiconductor 130-2 of the second transistor T2. The second gate layer connection portion 164 is connected to the second electrode of the second semiconductor 130-2 of the second transistor T2 through two contact openings 41 and 42, and is connected to the data line 171 through a contact opening 59.

The second gate layer connection portion 165 has an island-like structure, and overlaps the driving voltage line 175 and the first electrode (i.e., output side electrode) of the first semiconductor 130-1 of the first transistor T1. The second gate layer connection portion 165 is connected to the first electrode of the first transistor T1 through two contact openings 51 and 52, and is connected to the driving voltage line 175 through two contact openings 53.

The second gate layer connection portion 166 has an island-like structure, and overlaps the initialization voltage second transmitting portion 184 and the first electrode of the third semiconductor 130-3 region of the third transistor T3. The second gate layer connection portion 166 is connected to the second electrode of the third transistor T3 through two contact openings 47 and 48, and is connected to the initialization voltage second transmitting portion 184 through a contact opening 78.

The second gate layer connection portion 167 has an island-like structure, and overlaps the third gate electrode connection portion 183 and the gate electrode 147 of the third transistor T3. The second gate layer connection portion 167 is connected to the gate electrode 147 of the third transistor T3 through a contact opening 54, and is connected to the third gate electrode connection portion 183 through a contact opening 55.

An interlayer insulating film 13 is covered on the second gate layers 161, 162, 163, 164, 165, 166, and 167 and the second gate insulating film 12-1. The interlayer insulating film 13 may include an inorganic insulating material.

The data layers 171, 173, 175, 177, 182, 183, 184, and 185 are disposed on the interlayer insulating film 13. The data layers include a data line 171, the initialization voltage line 173, the driving voltage line 175, a driving low voltage line 177, the second gate electrode connection portion 182, the third gate electrode connection portion 183, the initialization voltage second transmitting portion 184, and the anode connection portion 185.

The data line 171 is disposed for each pixel column, and is extended in the column direction. The data line 171 is connected to the second gate layer connection portion 164 and the second semiconductor 130-2 of the second transistor T2 through the contact opening 59 to apply a data voltage to the second transistor T2.

The initialization voltage line 173 extends in the column direction, and applies the initialization voltage. The initialization voltage line 173 is not disposed for each pixel column, and in the present embodiment, one initialization voltage line 173 is disposed per pixel PX column including three subpixels PX1, PX2, and PX3. The initialization voltage line 173 is connected to the initialization voltage transmitting portion 144 through a contact opening 63, and the initialization voltage transmitting portion 144 is connected to the initialization voltage second transmitting portion 184 through a contact opening 79. The initialization voltage second transmitting portion 184 is connected to the second gate layer connection portion 166 and the third semiconductor 130-3 of the third transistor T3 through the contact opening 78. As a result, an initialization voltage is applied to the first electrode of the third transistor T3 of each pixel.

The driving voltage line 175 and the driving low voltage line 177 also extend in the column direction. The driving voltage line 175 is disposed for each pixel column, but the driving low voltage line 177 is disposed per one pixel column PX including three subpixels PX1, PX2, and PX3. The driving voltage line 175 transmits the driving voltage ELVDD, and is connected to the second gate layer connection portion 165 and the first semiconductor 130-1 of the driving transistor T1 through the two contact openings 53 to transmit the driving voltage ELVDD to the first electrode of the driving transistor T1. The driving voltage line 175 may have a narrower width than the driving low voltage line 177. The driving low voltage line 177 may have a narrow width in a region overlapping a wire disposed in another layer, and in FIG. 8, it has a narrow width in a portion overlapping the scan line 142. The reason that the driving low voltage line 177 has a wide width is to form a structure that is electrically connected to transmit the second power voltage ELVSS to the cathode electrode disposed at an upper portion thereof. In other words, it is because a predetermined level of width is required in order to be electrically connected by forming a contact by a laser or the like.

The second gate electrode connection portion 182 has an island-like structure, and overlaps the scan line 142 and the second gate layer connection portion 162. The second gate layer connection portion 162 overlaps the gate electrode 146 of the second transistor T2. The second gate electrode connection portion 182 is connected to the scan line 142 and the second gate layer connection portion 162 through contact openings 72 and 46, respectively, and the second gate layer connection portion 162 is connected to the gate electrode 146 of the second transistor T2 through the contact opening 45 to transmit a scan signal applied to the scan line 142 to the gate electrode 146 of the second transistor T2.

The third gate electrode connection portion 183 has an island-like structure, and overlaps the previous scan line 143 and the second gate layer connection portion 167. The second gate layer connection portion 167 overlaps the gate electrode 147 of the third transistor T3. The third gate electrode connection portion 183 is connected to the second gate layer connection portion 167 and the previous scan line 143 through contact openings 77 and 55, respectively, and the second gate layer connection portion 167 is connected to the gate electrode 146 of the third transistor T3 through the contact opening 54 to transmit a previous scan signal applied to the previous scan line 143 to the gate electrode 147 of the third transistor T3.

The anode connection portion 185 is connected to the second extension of the storage electrode 161 through two contact openings 84 defined thereunder, and is connected to the pixel electrode 191 through a contact opening 81 defined thereon. As a result, an output current of the first transistor T1 is transmitted to the pixel electrode 191.

An organic insulating film 15 is disposed on the data layers 171, 173, 175, 177, 182, 183, 184, and 185 and the interlayer insulating film 13. The organic insulating film 15 may include an organic insulating material.

The pixel electrode 191 is disposed on the organic insulating film 15. The pixel electrode 191 may be connected to the anode connection portion 185 through a contact opening 81, and may be connected to the storage electrode 161 through the contact opening 84.

Hereinafter, a display device including a transistor according to another embodiment of the present invention will be described with reference to FIG. 11 and FIG. 12. Features that are different from the embodiments of FIG. 1 to FIG. 3 will be mainly described.

Figure 11:
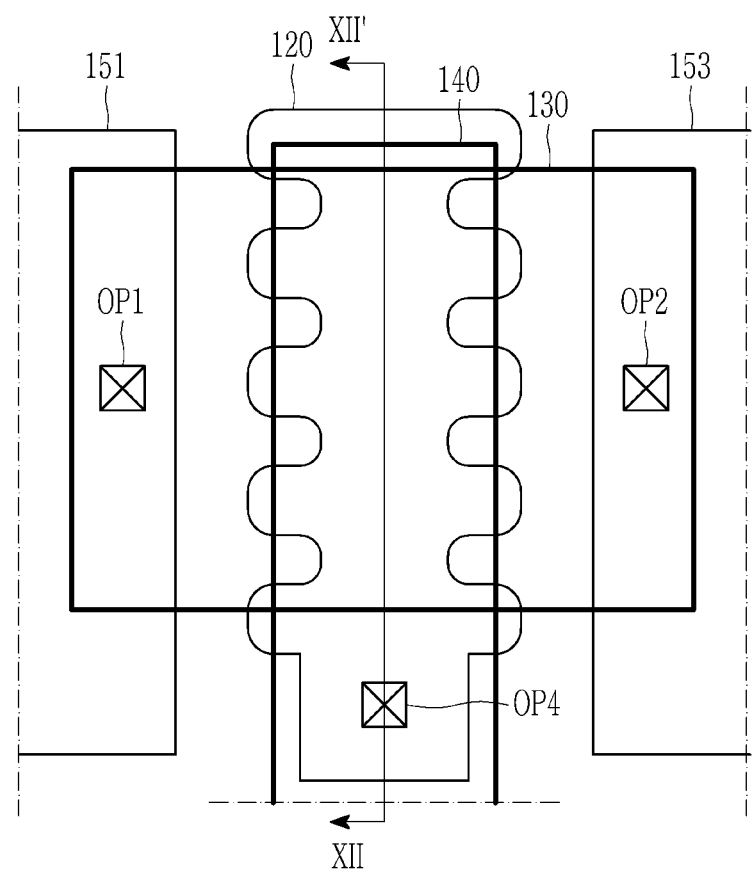
FIG. 11 illustrates a top plan view of another example of a transistor included in a display device according to an embodiment of the present invention.

FIG. 11 illustrates a top plan view of another example of a transistor included in a display device according to an embodiment of the present invention. FIG. 12 illustrates a cross-sectional view of the display device taken along line XII-XII' of FIG. 11.

Figure 12:
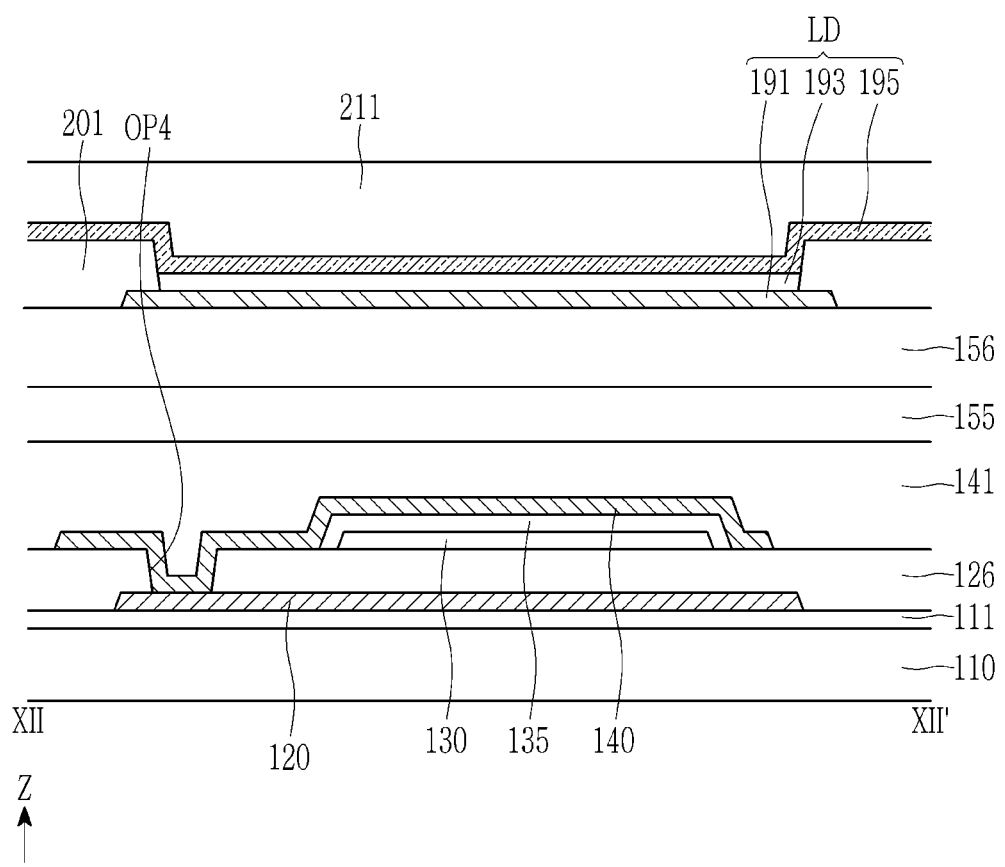
FIG. 12 illustrates a cross-sectional view of the display device taken along line XII-XII' of FIG. 11.

Referring to FIG. 11 and FIG. 12, unlike the embodiments of FIG. 1 to FIG. 3, the lower layer 120 is electrically connected to the gate electrode 140, while it is not electrically connected to the first electrode 151 or the second electrode 153. The buffer layer 126 disposed on the lower layer 120 defines a fourth opening OP4. The fourth opening OP4 may not overlap the semiconductor layer 130, and may be disposed at a portion in which the lower layer 120 and the gate electrode 140 overlap in a plan view. The gate electrode 140 may contact the lower layer 120 through the fourth opening OP4.

Except for the above-described differences, all of the features of the embodiments described above with reference to FIG. 1 to FIG. 6 may be applied to the embodiment described with reference to FIG. 11 and FIG. 12, so redundant descriptions will be omitted. Particularly, the lower layer 120 according to the embodiment of FIG. 11 and FIG. 12 may include the planar features according to the embodiment of FIG. 3 to FIG. 6.

While this invention has been described in connection with what is presently considered to be practical embodiments, it is to be understood that the invention is not limited to the disclosed embodiments, but, on the contrary, is intended to cover various modifications and equivalent arrangements included within the spirit and scope of the appended claims. Therefore, those skilled in the art will understand that various modifications and other equivalent embodiments of the present invention are possible. Consequently, the true technical protective scope of the present invention must be determined based on the technical spirit of the appended claims.

What is claimed is:

1. A display device comprising
   a substrate and
   a transistor on the substrate,
   wherein the transistor includes:
   a lower layer having conductivity and including a body portion and a plurality of protrusions;
   an oxide semiconductor layer including a channel region, a first conductive region disposed at a first side of the channel region, and a second conductive region disposed at a second side of the channel region, wherein the second side is opposite the first side;
   a gate electrode overlapping the channel region in a plan view;
   a first electrode electrically connected to the first conductive region; and
   a second electrode electrically connected to the second conductive region,
   wherein the plurality of protrusions protrudes from an overlapped region where the body portion and the channel region overlap each other,
   wherein the plurality of protrusions include a plurality of first protrusions extending in a first direction and a plurality of second protrusions extending in a direction opposite to the first direction.

2. The display device of claim 1, wherein the lower layer is electrically connected to the first electrode.

3. The display device of claim 1, wherein the lower layer is electrically connected to the gate electrode.

4. The display device of claim 1, wherein the plurality of protrusions protrudes from opposite sides of the body portion in the first direction and in the direction opposite to the first direction.

5. The display device of claim 4, wherein the plurality of protrusions symmetrically protrudes from the opposite sides of the body portion with respect to the body portion.

6. The display device of claim 4, wherein the plurality of protrusions asymmetrically protrudes from the opposite sides of the body portion with respect to the body portion.

7. The display device of claim 1, wherein a first portion of a protrusion of the plurality of protrusions overlaps the channel region, and a remaining portion of the protrusion except for the first portion does not overlap the channel region in the plan view.

8. The display device of claim 1, wherein the lower layer defines a plurality of trenches that are empty portions between the plurality of protrusions.

9. The display device of claim 8, wherein a first portion of a trench of the plurality of trenches overlaps the channel region, and a remaining portion of the trench except for the first portion of the trench does not overlap the channel region in the plan view.

10. The display device of claim 1, wherein the lower layer, including the body portion and the plurality of protrusions, has a first width in the first direction, the body portion has a second width in the first direction,
the gate electrode has a gate width in the first direction, the first width of the lower layer is larger than the gate width of the gate electrode, and the gate width of the gate electrode is larger than the second width of the body portion.

11. The display device of claim 1, wherein:
a protrusion of the plurality of protrusions has a first protruding width in the first direction, in which the protrusion protrudes from the body portion, and a second protruding width in a second direction crossing the first direction, and
the first protruding width and the second protruding width are the same.

12. The display device of claim 11, wherein:
the lower layer defines a plurality of trenches that are empty portions between the plurality of protrusions,
a trench of the plurality of trenches has a first trench width in the second direction, and
the first trench width and the second protruding width are the same.

13. The display device of claim 12, wherein each of the first protruding width, the second protruding width, and the first trench width is about 1.5 micrometers (μm).

14. The display device of claim 1, wherein the plurality of protrusions does not overlap the channel region and overlap the first conductive region or the second conductive region in the plan view.

15. The display device of claim 1, wherein the lower layer, including the body portion and the plurality of protrusions, has a first width in the first direction, the body portion has a second width in the first direction, the gate electrode has a gate width in the first direction,
the second width of the body portion is equal to or larger than the gate width of the gate electrode, and the plurality of protrusions do not overlap the channel region in the plan view.

16. The display device of claim 1, wherein:
a protrusion of the plurality of protrusions has a first protruding width in the first direction, in which the protrusion protrudes from the body portion, and a second protruding width in a second direction crossing the first direction, and
the second protruding width is larger than the first protruding width.

17. The display device of claim 16, wherein:
the lower layer defines a plurality of trenches that are empty portions between the plurality of protrusions,
a trench of the plurality of trenches has a first trench width in the second direction, and
the first trench width and the second protruding width are the same.

18. A display device comprising:
a driving voltage line;
a light emitting element including an anode and a cathode;
a capacitor;
a transistor including a gate electrode connected to the capacitor, an oxide semiconductor layer including a channel region, a first electrode connected to the anode of the light emitting element, and a second electrode connected to the driving voltage line; and
a lower layer electrically connected to the first electrode and including an overlapped region where a body portion and the channel region of the transistor overlap each other in a plan view and a plurality of protrusions protruding from the overlapped region,
wherein the plurality of protrusions include a plurality of first protrusions extending in a first direction and a plurality of second protrusions extending in a direction opposite to the first direction.

19. The display device of claim 18, wherein a first portion of a protrusion of the plurality of protrusions overlaps the channel region, and a remaining portion of the protrusion except for the first portion does not overlap the channel region in the plan view.

20. The display device of claim 18, wherein:
the lower layer, including the body portion and the plurality of protrusions, has a first width in the first direction, the body portion has a second width in the first direction, the gate electrode has a gate width in the first direction,
the first width of the lower layer is larger than the gate width of the gate electrode, and the gate width of the gate electrode is larger than the second width of the body portion.

* * * * *